(12) United States Patent
Zhao et al.

(10) Patent No.: US 10,578,907 B2
(45) Date of Patent: Mar. 3, 2020

(54) DISPLAY PANEL AND DISPLAY DEVICE

(71) Applicant: SHENZHEN CHINA STAR OPTOELECTRONICS TECHNOLOGY CO., LTD., Shenzhen, Guangdong (CN)

(72) Inventors: Li Zhao, Guangdong (CN); Xiangyang Xu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 471 days.

(21) Appl. No.: 15/329,460

(22) PCT Filed: Jan. 13, 2017

(86) PCT No.: PCT/CN2017/071159
§ 371 (c)(1),
(2) Date: Jan. 26, 2017

(87) PCT Pub. No.: WO2018/120306
PCT Pub. Date: Jul. 5, 2018

(65) Prior Publication Data
US 2019/0235309 A1 Aug. 1, 2019

(30) Foreign Application Priority Data
Dec. 28, 2016 (CN) .......................... 2016 1 1238363

(51) Int. Cl.
*G02F 1/1335* (2006.01)
*G02F 1/133* (2006.01)
(Continued)

(52) U.S. Cl.
CPC ...... *G02F 1/133514* (2013.01); *G02F 1/1343* (2013.01); *G02F 1/1345* (2013.01);
(Continued)

(58) Field of Classification Search
CPC ........... G02F 1/133514; G02F 1/13306; G02F 1/1343; G02F 1/1345; G02F 1/13452; G02F 1/13458; H01L 27/1214; H01L 27/124

See application file for complete search history.

(56) References Cited

U.S. PATENT DOCUMENTS

2005/0128416 A1   6/2005  Hashimoto
2015/0131041 A1*  5/2015  Moriwaki ............. G02F 1/1337
                                                         349/106

FOREIGN PATENT DOCUMENTS

CN   1451994 A   10/2003
CN   101510029 A   8/2009
(Continued)

*Primary Examiner* — Nathanael R Briggs
(74) *Attorney, Agent, or Firm* — Muncy, Geissler, Olds & Lowe, P.C.

(57) ABSTRACT

A display panel and a display device are provided. The display panel has a thin film transistor array substrate, a color filter substrate, and a liquid crystal layer. An area of the thin film transistor array substrate corresponding to the peripheral region of the display panel is disposed with a first conductor and a conductive member, and an area of the color filter substrate corresponding to the peripheral region is disposed with a second conductor for connecting to the first conductor and the conductive member. The present disclosure can avoid the conductor being broken and defective from decreasing the width of the conductor.

3 Claims, 2 Drawing Sheets

(51) Int. Cl.
*G02F 1/1343* (2006.01)
*H01L 27/12* (2006.01)
*G02F 1/1345* (2006.01)

(52) U.S. Cl.
CPC ...... *G02F 1/13306* (2013.01); *G02F 1/13452* (2013.01); *H01L 27/124* (2013.01); *H01L 27/1214* (2013.01)

(56) References Cited

FOREIGN PATENT DOCUMENTS

| | | |
|---|---|---|
| CN | 102830550 A | 12/2012 |
| CN | 104597678 A | 5/2015 |
| JP | 2005173108 A | 6/2005 |

\* cited by examiner

DISPLAY PANEL AND DISPLAY DEVICE

FIELD OF THE INVENTION

The present disclosure relates to a technical field of displays, and in particular to a display panel and a display device.

BACKGROUND OF THE INVENTION

Traditional display panels typically include a combination of a display device and conductors, the display device is disposed in a display region of the display panel, and the conductors are disposed in a peripheral region of the display panel.

A combination of the conductors has a predetermined number of conductors, and the conductors are electrically connected to the display device. The conductors are configured to transmit electrical signals to the display device.

In the case which the size of the display region is increased, the size of the peripheral region could be decreased, and the width of the conductor needs to be decreased to dispose a predetermined number of the conductors. However, decreasing the width of the conductor could make the conductor broken and defective.

As a result, it is necessary to provide a new solution to solve the problems existing in the conventional technologies, as described above.

SUMMARY OF THE INVENTION

An object of the present disclosure is to provide a display panel and a display device, which can avoid the conductor being broken and defective from decreasing the width of the conductor when the size of the peripheral region of the display panel is limited, and the number of the conductors is regular.

To achieve the above objects, the present disclosure provides a display panel, which is disposed with a display region and a peripheral region formed on at least one side of the display region, and comprises: a thin film transistor array substrate comprising: an area corresponding to the display region disposed with a circuit device; and an area corresponding to the peripheral region disposed with a first conductor connected to the circuit device, and a conductive member; a color filter substrate comprising: an area corresponding to the display region disposed with a common electrode; and an area corresponding to the peripheral region disposed with a second conductor; and a liquid crystal layer disposed between the thin film transistor array substrate and the color filter substrate. The second conductor is configured to connect to the conductive member and the first conductor when the thin film transistor array substrate and the color filter substrate are combined with each other, so that a current channel between the conductive member and the first conductor is turned on. The first conductor comprises: a first end connected to the circuit device, and second end; the second conductor comprises a third end and a fourth end; an area of the third end disposed within the color filter substrate corresponds to an area of the conductive member disposed within the thin film transistor array substrate; and an area of the second end disposed within the thin film transistor array substrate corresponds to an area of the fourth end disposed within the color filter substrate. A surface of the first conductor is disposed with a first insulating film, and a surface of the second conductor is disposed with a second insulating film. An area of the thin film transistor array substrate corresponding to the peripheral region is disposed with a first adapter connected to the conductive member, and a second adapter connected to the second end of the first conductor. The third end of the second conductor connects to the first adapter, and the fourth end of the second conductor connects to the second adapter when the thin film transistor array substrate and the color filter substrate are combined with each other. An area of the color filter substrate corresponding to the peripheral region is disposed with a third adapter connected to the third end of the second conductor, and a fourth adapter connected to the fourth end of the second conductor. The third adapter connects to the first adapter, and the fourth adapter connects to the second adapter when the thin film transistor array substrate and the color filter substrate are combined with each other.

In one embodiment of the present disclosure, a first elastic conductive block is disposed between the first adapter and the third adapter, and a second elastic conductive block is disposed between the second adapter and the fourth adapter.

In one embodiment of the present disclosure, the common electrode and the second conductor are formed by disposing a first electrode layer on an area of the color filter substrate corresponding to the display region and the peripheral region and by using a laser to cut at least one part of the first electrode layer located in the peripheral region.

In one embodiment of the present disclosure, the common electrode and the second conductor are formed by disposing a second electrode layer on an area of the color filter substrate corresponding to the display region and the peripheral region and by implementing a mask process on the second electrode layer and removing at least one part of the second electrode layer located in the peripheral region.

To achieve the above objects, the present disclosure provides a display panel, which is disposed with a display region and a peripheral region formed on at least one side of the display region, and comprises: a thin film transistor array substrate comprising: an area corresponding to the display region disposed with a circuit device; and an area corresponding to the peripheral region disposed with a first conductor connected to the circuit device, and a conductive member; a color filter substrate comprising: an area corresponding to the display region disposed with a common electrode; and an area corresponding to the peripheral region disposed with a second conductor; and a liquid crystal layer disposed between the thin film transistor array substrate and the color filter substrate. The second conductor is configured to connect to the conductive member and the first conductor when the thin film transistor array substrate and the color filter substrate are combined with each other, so that a current channel between the conductive member and the first conductor is turned on.

In one embodiment of the present disclosure, the first conductor comprises: a first end connected to the circuit device, and second end; the second conductor comprises a third end and a fourth end; an area of the third end disposed within the color filter substrate corresponds to an area of the conductive member disposed within the thin film transistor array substrate; and an area of the second end disposed within the thin film transistor array substrate corresponds to an area of the fourth end disposed within the color filter substrate.

In one embodiment of the present disclosure, an area of the thin film transistor array substrate corresponding to the peripheral region is disposed with a first adapter connected to the conductive member, and a second adapter connected to the second end of the first conductor; and the third end of the second conductor connects to the first adapter, and the fourth end of the second conductor connects to the second adapter when the thin film transistor array substrate and the color filter substrate are combined with each other.

In one embodiment of the present disclosure, an area of the color filter substrate corresponding to the peripheral region is disposed with a third adapter connected to the third end of the second conductor, and a fourth adapter connected to the fourth end of the second conductor; and the third adapter connects to the first adapter, and the fourth adapter connects to the second adapter when the thin film transistor array substrate and the color filter substrate are combined with each other.

In one embodiment of the present disclosure, a first elastic conductive block is disposed between the first adapter and the third adapter, and a second elastic conductive block is disposed between the second adapter and the fourth adapter.

In one embodiment of the present disclosure, a surface of the first conductor is disposed with a first insulating film, and a surface of the second conductor is disposed with a second insulating film.

In one embodiment of the present disclosure, the common electrode and the second conductor are formed by disposing a first electrode layer on an area of the color filter substrate corresponding to the display region and the peripheral region and by using a laser to cut at least one part of the first electrode layer located in the peripheral region.

In one embodiment of the present disclosure, the common electrode and the second conductor are formed by disposing a second electrode layer on an area of the color filter substrate corresponding to the display region and the peripheral region and by implementing a mask process on the second electrode layer and removing at least one part of the second electrode layer located in the peripheral region.

To achieve the above objects, the present disclosure provides a display device, which is comprises a backlight module and a display panel, the display panel is disposed with a display region and a peripheral region formed on at least one side of the display region, and includes: a thin film transistor array substrate comprising: an area corresponding to the display region disposed with a circuit device; and an area corresponding to the peripheral region disposed with a first conductor connected to the circuit device, and a conductive member; a color filter substrate comprising: an area corresponding to the display region disposed a common electrode; and an area corresponding to the peripheral region disposed a second conductor; and a liquid crystal layer disposed between the thin film transistor array substrate and the color filter substrate. The second conductor is configured to connect to the conductive member and the first conductor when the thin film transistor array substrate and the color filter substrate are combined with each other, so that a current channel between the conductive member and the first conductor is turned on.

In one embodiment of the present disclosure, the first conductor comprises: a first end connected to the circuit device, and second end; the second conductor comprises a third end and a fourth end; an area of the third end disposed within the color filter substrate corresponds to an area of the conductive member disposed within the thin film transistor array substrate; and an area of the second end disposed within the thin film transistor array substrate corresponds to an area of the fourth end disposed within the color filter substrate.

In one embodiment of the present disclosure, an area of the thin film transistor array substrate corresponding to the peripheral region is disposed with a first adapter connected to the conductive member, and a second adapter connected to the second end of the first conductor; and the third end of the second conductor connects to the first adapter, and the fourth end of the second conductor connects to the second adapter when the thin film transistor array substrate and the color filter substrate are combined with each other.

In one embodiment of the present disclosure, an area of the color filter substrate corresponding to the peripheral region is disposed with a third adapter connected to the third end of the second conductor, and a fourth adapter connected to the fourth end of the second conductor; and the third adapter connects to the first adapter, and the fourth adapter connects to the second adapter when the thin film transistor array substrate and the color filter substrate are combined with each other.

In one embodiment of the present disclosure, a first elastic conductive block is disposed between the first adapter and the third adapter, and a second elastic conductive block is disposed between the second adapter and the fourth adapter.

In one embodiment of the present disclosure, a surface of the first conductor is disposed with a first insulating film, and a surface of the second conductor is disposed with a second insulating film.

In one embodiment of the present disclosure, the common electrode and the second conductor are formed by disposing a first electrode layer on an area of the color filter substrate corresponding to the display region and the peripheral region and by using a laser to cut at least one part of the first electrode layer located in the peripheral region.

In one embodiment of the present disclosure, the common electrode and the second conductor are formed by disposing a second electrode layer on an area of the color filter substrate corresponding to the display region and the peripheral region and by implementing a mask process on the second electrode layer and removing at least one part of the second electrode layer located in the peripheral region.

Compared with the prior art, the second conductor, the first conductor located on the thin film transistor array substrate, and the conductive member are connected by disposing the second conductor on the color filter substrate. Therefore, a part of the conductor of the thin film transistor array substrate within the peripheral region is transferred to the color filter substrate, and an area of the thin film transistor array substrate corresponding to the peripheral region with an enough space to receive the conductor (such as the first conductor) without decreasing the width of the conductor within the peripheral region, so that the conductor can avoid being broken and defective.

To make the above-described present disclosure more fully comprehensible, preferred embodiments are provided below, accompanied with figures, and are described in detail as follows.

DETAILED DESCRIPTION OF THE PREFERRED EMBODIMENTS

Regarding the words used in this specification, "an embodiment" means serving as an example, instance, or illustration. In addition, in this specification and the appended claims used in the articles "a/an" in general can be interpreted to mean "one or more" unless specified otherwise or clear from context to determine a singular form.

Figure 1:
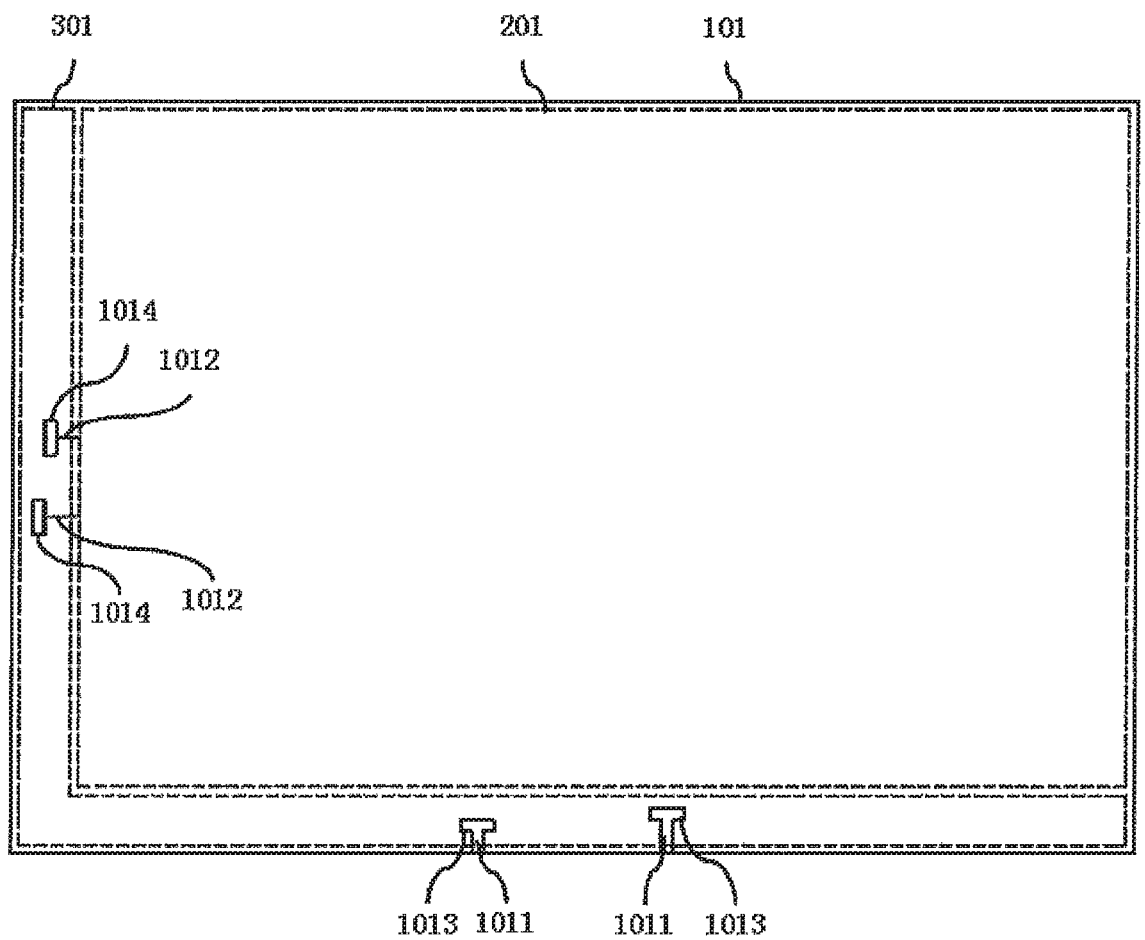
FIG. 1 is a schematic view of a thin film transistor array substrate of a display panel of the present disclosure.
Figure 2:
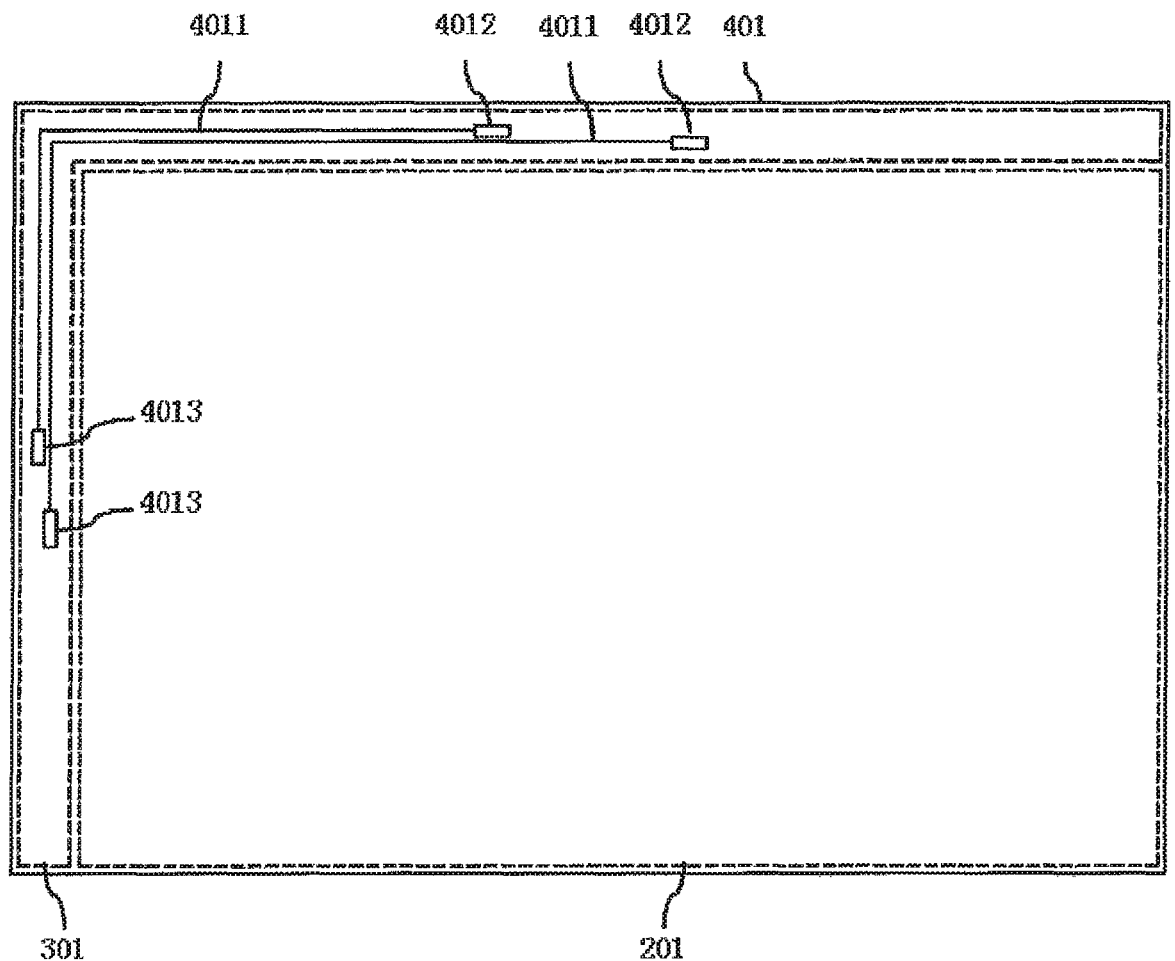
FIG. 2 is a schematic view of a color filter substrate of a display panel of the present disclosure.

Refer to FIGS. 1 and 2, which are a schematic view of a thin film transistor array substrate 101 of a display panel of the present disclosure, and a schematic view of a color filter substrate 401 of a display panel of the present disclosure.

A display device of the present disclosure comprises a backlight module and a display panel, wherein the display panel is a TFT-LCD (Thin Film Transistor Liquid Crystal Display).

A first embodiment of the display panel of the present disclosure is disposed with a display region 201 and a peripheral region 301, wherein the peripheral region 301 is formed on at least one side of the display region 201, and the display panel comprises a thin film transistor array substrate 101, a color filter substrate 401, and a liquid crystal layer.

An area of the thin film transistor array substrate 101 corresponding to the display region 201 is disposed with a circuit device, and an area of the thin film transistor array substrate 101 corresponding to the peripheral region is disposed with a first conductor 1012 and a conductive member 1011, wherein first conductor 1012 connects to the circuit device, and the circuit device is a combination of scan lines, data lines, and pixel cells, or a driver chip.

An area of the color filter substrate 401 corresponding to the display region 201 is disposed with a common electrode, and an area of the color filter substrate 401 corresponding to the peripheral region 301 is disposed with a second conductor 4011.

The liquid crystal layer is disposed between the thin film transistor array substrate 101 and the color filter substrate 401.

The second conductor 4011 is configured to contact and connect to the conductive member 1011 and the first conductor 1012 when the thin film transistor array substrate 101 and the color filter substrate 401 are stacked and combined with each other, so that a current channel between the conductive member 1011 and the first conductor 1012 is turned on.

In the display panel of the embodiment, the first conductor 1012 comprises a first end and a second end, and the second conductor 4011 comprises a third end and a fourth end. The first end connects to the circuit device, an area of the third end disposed within the color filter substrate 401 corresponds to an area of the conductive member 1011 disposed within the thin film transistor array substrate 101, and an area of the second end disposed within the thin film transistor array substrate 101 corresponds to an area of the fourth end disposed within the color filter substrate 401.

In the display panel of the embodiment, an area of the thin film transistor array substrate 101 corresponding to the peripheral region 301 is disposed with a first adapter 1913 and a second adapter 1014, wherein the first adapter 1913 connects to the conductive member 1011, and a second adapter 1014 connects to the second end of the first conductor 1012.

The third end of the second conductor 4011 contacts and connects to the first adapter 1013, and the fourth end of the second conductor 4011 contacts and connects to the second adapter 1014 when the thin film transistor array substrate 101 and the color filter substrate 401 are stacked and combined with each other.

In the display panel of the embodiment, the common electrode and the second conductor 4011 are formed by disposing an electrode layer (first electrode layer) on an area of the color filter substrate 401 corresponding to the display region 201 and the peripheral region 301 and by using a laser to cut at least one part of the electrode layer (first electrode layer) located in the peripheral region 301.

An area of the color filter substrate 401 corresponding to the peripheral region 301 is disposed with a third adapter 4012 and a fourth adapter 4013, wherein the third adapter 4012 connects to the third end of the second conductor 4011, and a fourth adapter 4013 connects to the fourth end of the second conductor 4011.

The third adapter 4012 contacts and connects to the first adapter 1013, and the fourth adapter 4013 contacts and connects to the second adapter 1014 when the thin film transistor array substrate 101 and the color filter substrate 401 are stacked and combined with each other.

As an improvement, a surface of the first conductor 1012 is disposed with a first insulating film, and a surface of the second conductor 4011 is disposed with a second insulating film.

As another improvement, a first elastic conductive block is disposed between the first adapter 1013 and the third adapter 4012, and the first elastic conductive block is configured to fill a gap between the first adapter 1013 and the third adapter 4012 when the thin film transistor array substrate 101 and the color filter substrate 401 are stacked and combined with each other, which prevents a poor contact between the first adapter 1013 and the third adapter 4012.

A second elastic conductive block is disposed between the second adapter 1014 and the fourth adapter 4013, and the second elastic conductive block is configured to fill a gap between the second adapter 1014 and the fourth adapter 4013 when the thin film transistor array substrate 101 and the color filter substrate 401 are stacked and combined with each other, which prevents a poor contact between the second adapter 1014 and the fourth adapter 4013.

The first elastic conductive block and the second elastic conductive block are rubber blocks, and the surface of which are coated with a conductive material, such as conductive plastic.

The surface of the first adapter 1013, the second adapter 1014, the third adapter 4012, and the fourth adapter 4013 are disposed raised arrays. The array includes at least two protrusions, and the end of the protrusions are tip-like. The protrusions are configured to engage the first elastic conductive block and/or second elastic conductive block.

Two opposite surfaces of the first elastic conductive block are disposed with a first cavity and a second cavity, respectively, wherein a shape and an area of the first cavity corresponds to a shape and an area of the first adapter 1013, and a shape and an area of the second cavity corresponds to a shape and an area of the third adapter 4102. The first cavity and the second cavity are engaged with the first adapter 1013 and the third adapter 4012, respectively.

Two opposite surfaces of the second elastic conductive block are disposed with a third cavity and a fourth cavity, respectively, wherein a shape and an area of the third cavity corresponds to a shape and an area of the second adapter 1014, and a shape and an area of the fourth cavity corresponds to a shape and an area of the fourth adapter 4013. The third cavity and the fourth cavity are engaged with the second adapter 1014 and the fourth adapter 4013, respectively.

A second embodiment of the display panel of the present disclosure is similar to the first embodiment, the difference is in the following:

The common electrode and the second conductor 4011 are formed by disposing an electrode layer (second electrode layer) on an area of the color filter substrate 401 corresponding to the display region 201 and the peripheral region 301, and by implementing a mask process on the second electrode layer and removing at least one part of the electrode layer (second electrode layer) located in the peripheral region 301.

As described above, the second conductor 4011, the first conductor 1012 located on the thin film transistor array substrate 101 and the conductive member 1011 are connected by disposing the second conductor 4011 on the color filter substrate 401. Therefore, a part of the conductor of the thin film transistor array substrate within the peripheral region 301 is transferred to the color filter substrate 401, and an area of the thin film transistor array substrate 101 corresponding to the peripheral region 301 with enough space to receive the conductor (such as the first conductor) without decreasing the width of the conductor within the peripheral region 301, so that the conductor can avoid being broken and defective. In this case which the size of the peripheral region 301 of the display panel is limited, and the number of the conductors is regular, the present disclosure can avoid the conductors being broken and defective from decreasing the width of the conductor.

In addition, the present disclosure also avoids ESD (Electro Static Discharge) from generating passing lines in the thin film transistor array substrate.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A display panel, disposed with a display region and a peripheral region formed on at least one side of the display region, and comprising:
    a thin film transistor array substrate comprising: an area corresponding to the display region disposed with a circuit device; and an area corresponding to the peripheral region disposed with a first conductor connected to the circuit device, and a conductive member;
    a color filter substrate comprising: an area corresponding to the display region disposed with a common electrode; and an area corresponding to the peripheral region disposed with a second conductor; and
    a liquid crystal layer disposed between the thin film transistor array substrate and the color filter substrate;
    wherein the second conductor is configured to connect to the conductive member and the first conductor when the thin film transistor array substrate and the color filter substrate are combined with each other, so that a current channel between the conductive member and the first conductor is turned on;
    wherein the first conductor comprises: a first end connected to the circuit device, and second end; the second conductor comprises a third end and a fourth end; an area of the third end disposed within the color filter substrate corresponds to an area of the conductive member disposed within the thin film transistor array substrate; and an area of the second end disposed within the thin film transistor array substrate corresponds to an area of the fourth end disposed within the color filter substrate;
    wherein a surface of the first conductor is disposed with a first insulating film, and a surface of the second conductor is disposed with a second insulating film;
    wherein an area of the thin film transistor array substrate corresponding to the peripheral region is disposed with a first adapter connected to the conductive member, and a second adapter connected to the second end of the first conductor;
    wherein the third end of the second conductor connects to the first adapter, and the fourth end of the second conductor connects to the second adapter when the thin film transistor array substrate and the color filter substrate are combined with each other;
    wherein an area of the color filter substrate corresponding to the peripheral region is disposed with a third adapter connected to the third end of the second conductor, and a fourth adapter connected to the fourth end of the second conductor;
    wherein the third adapter connects to the first adapter, and the fourth adapter connects to the second adapter when the thin film transistor array substrate and the color filter substrate are combined with each other;
    wherein a first elastic conductive block is disposed between the first adapter and the third adapter, and a second elastic conductive block is disposed between the second adapter and the fourth adapter, wherein the first elastic conductive block and the second elastic conductive block are rubber blocks, wherein all surfaces of the first elastic conductive block and the second elastic conductive block are coated with a conductive material.

2. The display panel according to claim 1, wherein the common electrode and the second conductor are formed by disposing a first electrode layer on an area of the color filter substrate corresponding to the display region and the peripheral region and by using a laser to cut at least one part of the first electrode layer located in the peripheral region.

3. The display panel according to claim 1, wherein the common electrode and the second conductor are formed by disposing a second electrode layer on an area of the color filter substrate corresponding to the display region and the peripheral region and by implementing a mask process on the second electrode layer and removing at least one part of the second electrode layer located in the peripheral region.

* * * * *